(12) United States Patent
Botti et al.

(10) Patent No.: US 6,489,840 B2
(45) Date of Patent: Dec. 3, 2002

(54) POWER AMPLIFICATION EQUIPMENT

(75) Inventors: Edoardo Botti, Vigevano (IT); Antonio Grosso, Milan (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 09/920,444

(22) Filed: Aug. 1, 2001

(65) Prior Publication Data

US 2002/0024383 A1 Feb. 28, 2002

(30) Foreign Application Priority Data

Aug. 29, 2000 (EP) .......................................... 00830589

(51) Int. Cl.[7] ................................................ H03F 3/38
(52) U.S. Cl. ..................................... 330/10; 330/207 A
(58) Field of Search .............................. 330/10, 207 A, 330/251

(56) References Cited

U.S. PATENT DOCUMENTS

| 4,249,136 | A | * | 2/1981 | Suzuki et al. ................. 330/10 |
| 4,531,096 | A | * | 7/1985 | Yokoyama ..................... 330/10 |
| 5,262,733 | A |   | 11/1993 | Nakajima et al. .............. 330/10 |
| 5,805,020 | A |   | 9/1998 | Danz et al. .................... 330/10 |
| 6,346,852 | B1 | * | 2/2002 | Masini et al. .................. 330/10 |
| 6,356,151 | B1 | * | 3/2002 | Nalbant ........................ 330/10 |

FOREIGN PATENT DOCUMENTS

WO    WO 98/44626    10/1998

* cited by examiner

*Primary Examiner*—Tuan T. Lam
(74) *Attorney, Agent, or Firm*—Hogan & Hartson, LLP

(57) ABSTRACT

A power amplification apparatus receiving in input an enable signal (En) and an input square wave signal (C) is described. The apparatus comprises a device (6) receiving the input square wave signal (C) and the enable signal (En) and which produces a new enable signal (Ens) of the apparatus which is synchronized with a rise or down front of the input square wave signal (C), so that an output square wave signal (Vo) of the apparatus, which is normally shifted of a certain period fraction with respect to the square wave signal (C) in input to the apparatus, has the first (Ti) and the last (Tf) pulses which have a duration equal to a period fraction of the output square wave signal (Vo).

8 Claims, 5 Drawing Sheets

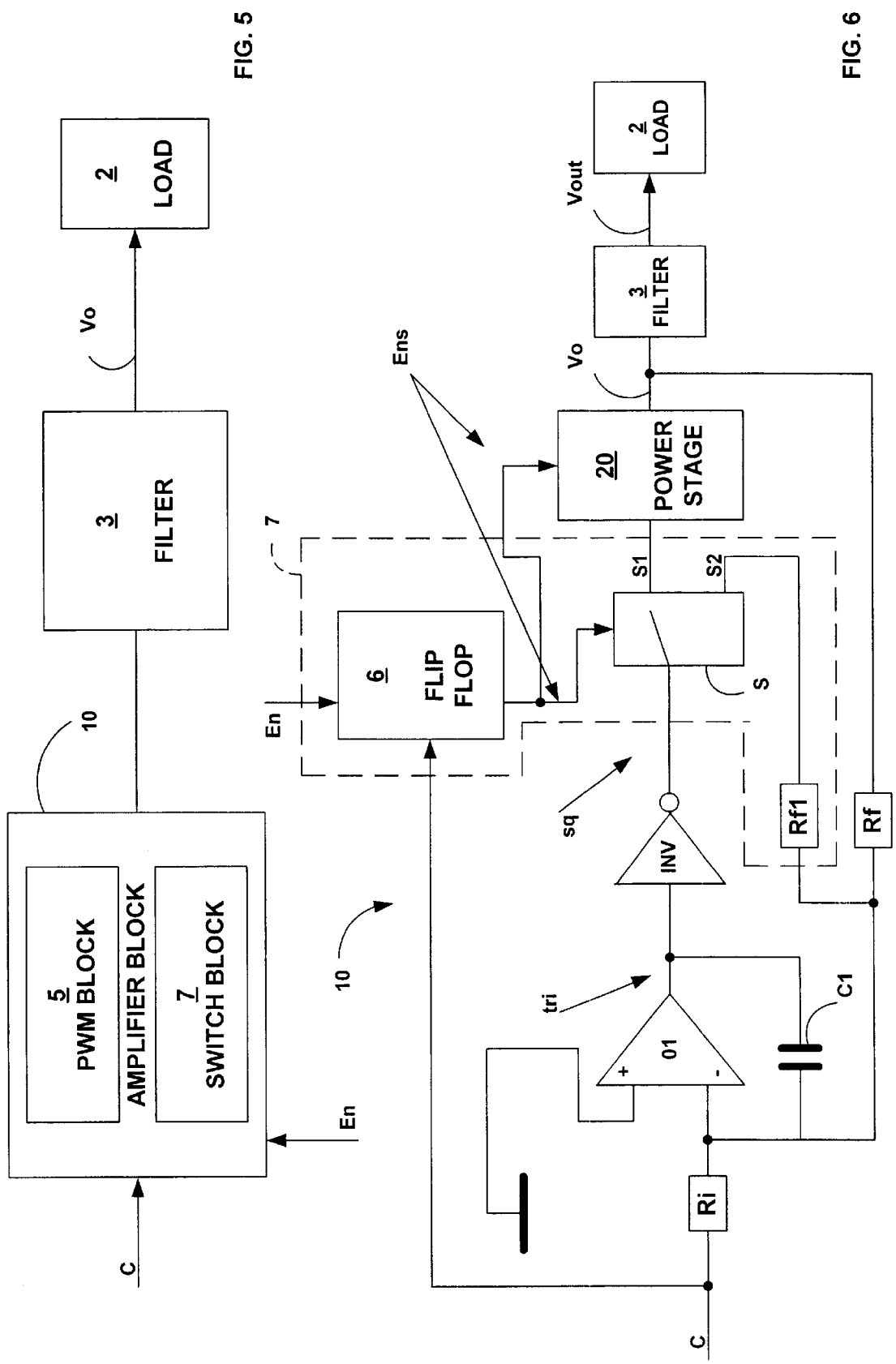

POWER AMPLIFICATION EQUIPMENT

DESCRIPTION

The present invention relates to a power amplification apparatus, particularly to an apparatus for amplifying audio signals.

The typical tendency to the reduction of the power consumption and of the weights and encumbrances of the heat dissipators has induced to require power audio amplifiers with a higher efficiency than the class-AB amplifiers from the apparatus constructors.

Class-D audio amplifiers have been proposed for satisfying such request, which comprise a DC-AC converter producing a pulse width modulated output signal (PWM); such signal in turn drives power switches driving a load provided with a passive filter for restoring the amplified audio signal.

A single output amplifier with analog input and PWM output (class-D amplifier) is described in the article "Analysis of a quality class-D amplifier", F. A. Himmelstoss, et al., I.E.E.E. Transactions on Consumer Electronics, Vol. 42, No. 3, August 1996.

The more and more wide interest toward the digital processing of the signals has induced to provide power amplifiers with analog or digital input.

A particular class of such power amplifier is that of the audio switching amplifiers wherein the output of the power PWM block amplifier 1 is separated from a load 2 (generally a loudspeaker) by means of a LC low-pass filter 3, as shown in FIG. 1. When the amplifier is turned on by means of the signal En, in absence of input audio signal, the voltage signal detected before the LC filter 3 is a square wave with a duty-cycle of 50%, that is the square wave signal of the modulator PWM which has been amplified. The voltage signal Vout which is in output from the LC filter 3, which in running state has a waveform schematically formed by a triangular wave with a void middle value, in the period Ti following the turning on has a non-void middle value which causes a noise audible to the loudspeaker, as shown in FIG. 2. An equal result is achieved during the turning off of the amplifier, in the period Tf. The wideness of such noise also is not constant but it depends on the instant of application of the turning on signal.

A solution actually used for eliminating such noises is to interpose between the LC low-pass filter 3 and the loudspeaker a relay 4 suitably driven by means of a signal Enrelais which is activated after a certain time period Ton from the turning on and is deactivated at a time Toff before the turning off of the device, so that the loudspeaker is excluded in the periods interested from the transient, as shown in FIGS. 3 and 4.

In view of the state of the art described, it is an object of the present invention to provide a power amplification apparatus which reduces the noises due to the turning on and turning off transients of the amplifier in a economic way.

According to the present invention, such object is attained by a power amplification apparatus receiving in input an enable signal and an input square wave signal, characterized by comprising a device which receives said input square wave signal and said enable signal and which produces a new enable signal for said apparatus which is synchronized with a rise or down front of the input square wave signal, so that an output square wave signal of said apparatus, which is normally shifted of a certain period fraction with respect to the square wave signal in input to the apparatus, has the first and the last pulses which have a duration equal to a period fraction of said output square wave signal.

The features and the advantages of the present invention will be made evident by the following detailed description of an embodiment thereof, illustrated as not limiting example in the annexed drawings, wherein:

FIG. 5 is a block diagram of a PWM amplification apparatus with a device for eliminating the turning on and turning off transients according to present invention;

FIG. 6 is a circuit scheme of the apparatus of FIG. 5;

Figure 1:
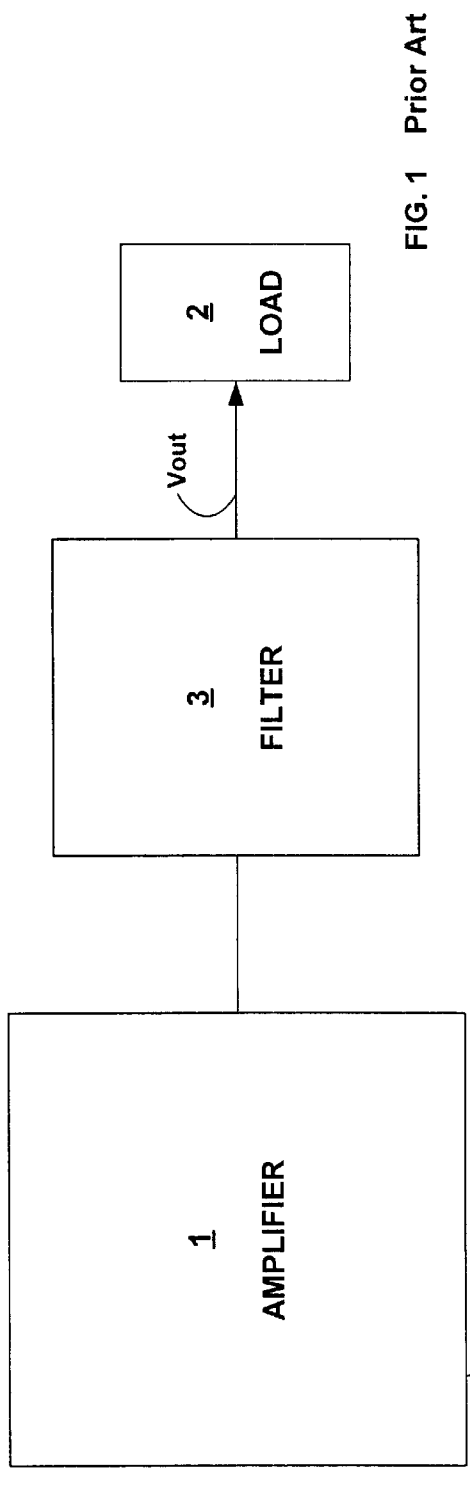
FIG. 1 is a block diagram of an audio amplifier according to prior art.
Figure 2:
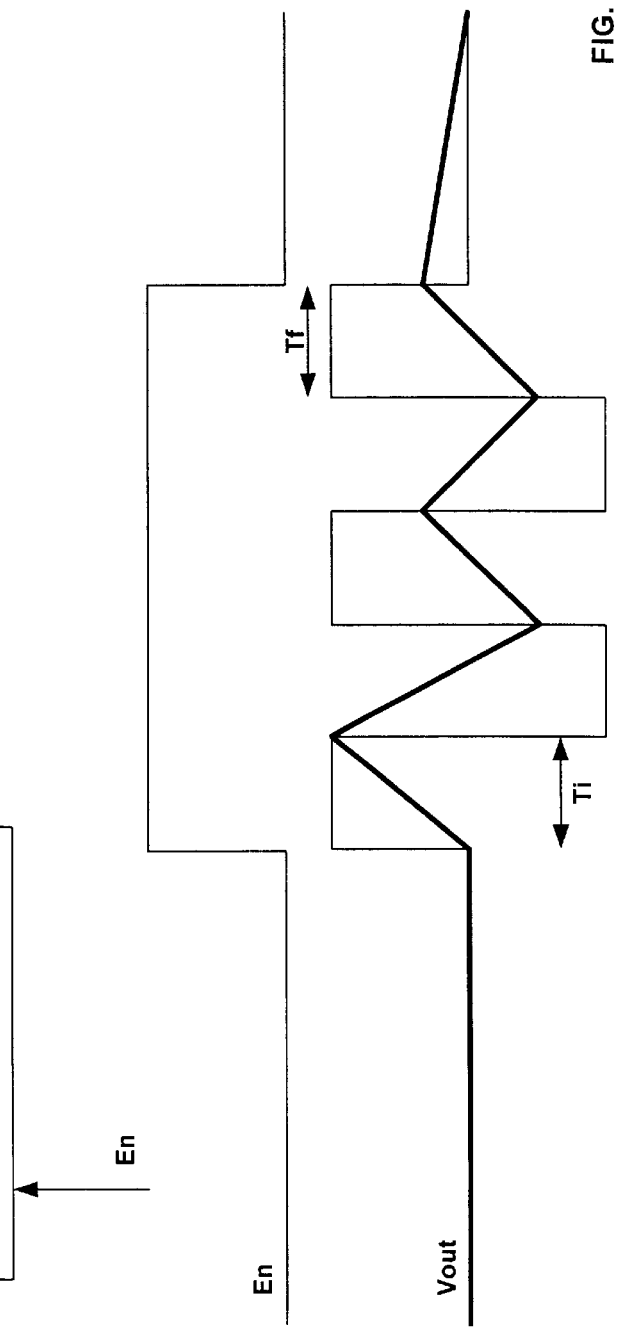
FIG. 2 shows some operation waveforms of the amplifier of FIG. 1.

In FIG. 1 is shown the block diagram of a typical audio switching amplifier wherein the output of the PWM power amplification block 1 is separated from a load 2 (generally a loudspeaker) by means of a LC low-pass filter 3. When the amplifier is turned on by means of the signal En, in absence of input audio signal, the voltage signal detected before the LC filter 3 is a square wave with a duty-cycle of 50%, that is the square wave signal of the modulator PWM which was amplified. The voltage signal Vout which is in output from the LC filter 3, which in running state has a waveform shown by means of a triangular wave with a void middle value, in the period Ti following the turning on has a non-void middle value which causes a noise audible at the loudspeaker, as shown in FIG. 2. An equal result is achieved during the turning off of the amplifier, in the period Tf.

Figure 3:
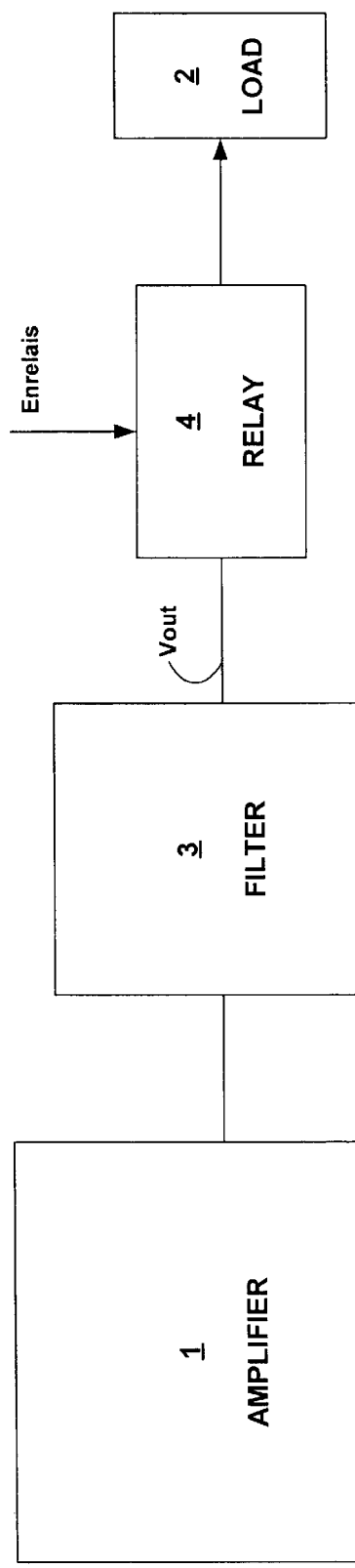
FIG. 3 is a block diagram of an audio amplifier with a device for eliminating the turning on and turning off transients according to prior art.
Figure 4:
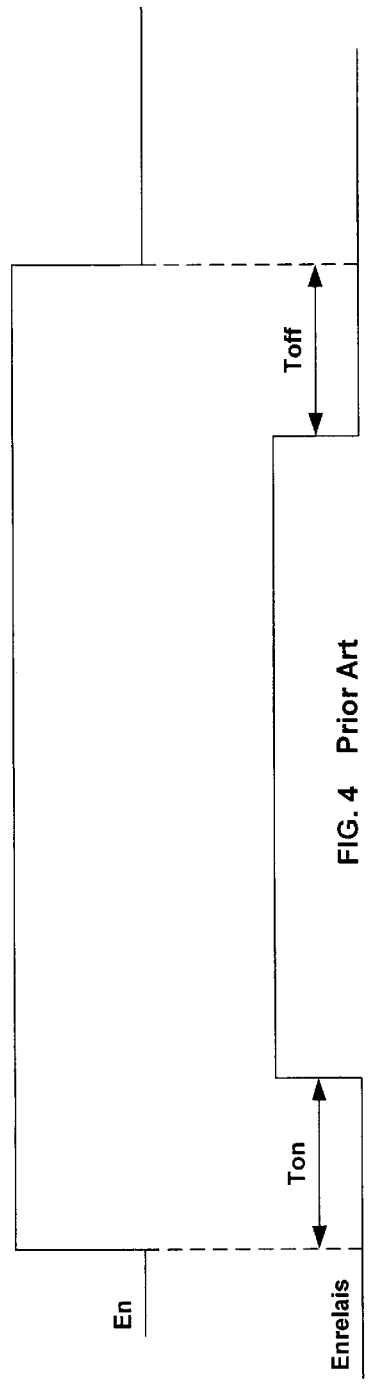
FIG. 4 shows some operation waveforms of the amplifier of FIG. 3.

In FIG. 3 the block diagram of the audio switching amplifier of FIG. 1 is shown which has a known device for eliminating the transients, that is a relay 4 placed between the LC low-pass filter 3 and the loudspeaker. The relay 4 is suitably driven by means of a signal Enrelais which is activated after a certain time period Ton from the turning on and is deactivated at a time Toff before the turning off of the device, so that the loudspeaker is excluded in the periods interested by the transient, as shown in FIG. 4.

In FIG. 5 the block diagram of an amplification apparatus according to present invention is shown. Such amplification apparatus comprises a signal amplification block 10 which in turn comprises a power amplification block 5 of the pulse width modulation type (PWM) and a block 7; such block 10 receives in input, in absence of an input audio signal, an input square wave signal C having a duty-cycle of 50% and an enable signal En (a signal causing the turning on and turning off of the amplifier). In the case wherein the input audio signal is a digital signal such square wave signal C is a PWM signal having a duty-cycle of 50% in the steps of turning on and turning off of the device (the modulating PWM signal which derives from a PWM modulation chain not shown in Figures), if instead the input audio signal is an analog signal, the square wave signal C is a clock signal having a duty-cycle of 50%, which is produced for example by an oscillator. The output PWM signal from the block 10 goes in input to the block 3 constituted by the LC filter the output of which drives the load 2.

In FIG. 6 is shown a circuit implementation of the amplification apparatus of FIG. 5. The block 5 comprises an integrator stage constituted by an operational amplifier O1, a capacitor C1 connected between the inverting input (−) of the operational amplifier O1 and the output thereof, a resistance Ri connected to the inverting input of the operational amplifier O1 and which has a free terminal to which the input signal C is applied. The non-inverting terminal of the operational amplifier O1 is connected to ground or to a reference voltage.

Figure 7:
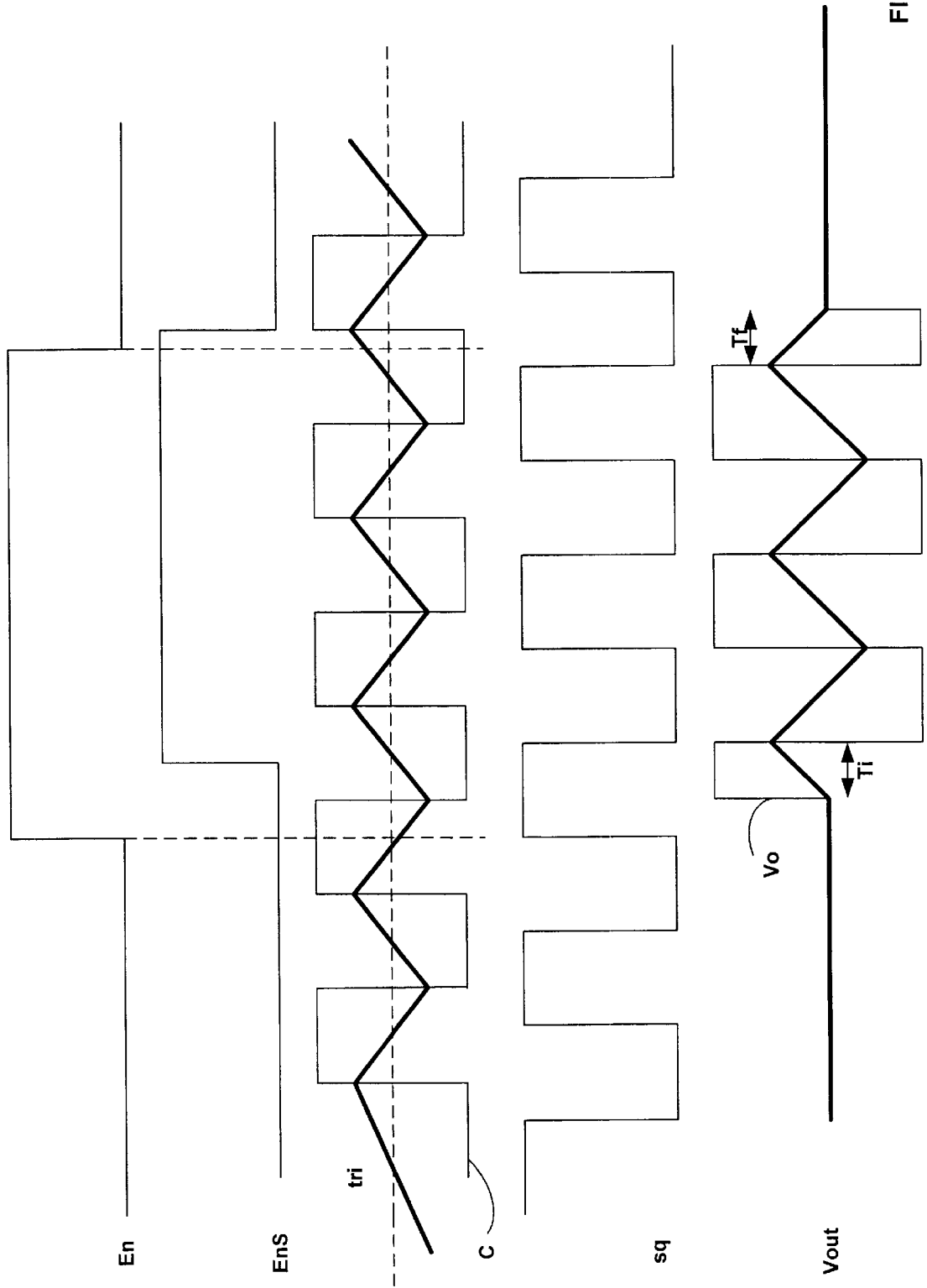
FIG. 7 shows the operation waveforms of the apparatus of FIG. 6.

A triangular signal tri shown in FIG. 7 is in output to the integrator stage. The triangular signal tri is squared by the logical block NV which can be a simple NOT logical gate, or an inverter or a cascade of NOT logical gates at the output of which a logical pulse width modulation signal sq is obtained which is a square wave shifted of ¼ of a cycle with respect to that in input.

The signal sq is sent in input to a switch S having two output terminals S1 and S2 the first of which is connected to a power output stage 20 and the second of which is connected to a resistance Rf1 having its other terminal connected to the inverting input of the operational amplifier O1. The current flowing in the resistances Rf and Rf1 must be lower than the current flowing in the resistance Ri so that the amplification apparatus operates correctly, how it is supposed in the description of the operation of the apparatus.

The switch S is controlled by a signal Ens in output from a device 6 which with the same switch S and with the resistance Rf1 forms the block 7 of the amplifier of FIG. 5.

The device 6 receives in input the signals C and En and it produces in output the signal Ens which is the signal En coincident with a rise or down front of the input signal C. The signal Ens causes the switch S to be disposed on the terminal SI and it causes the output signal Vo of the power stage 20 to have the first pulse Ti after its enabling and the last pulse Tf before its disenabling with a duration equal to ¼ of its period; this reduces the amplitude of the audible transient of the output signal Vo.

When the signal Ens is low the switch S is disposed at the terminal S2 that is at a terminal of the resistance Rf1 so that during the non-operation period of the power stage 20 the integrator stage does not diverge carrying itself out of the linearity state.

Figure 8:
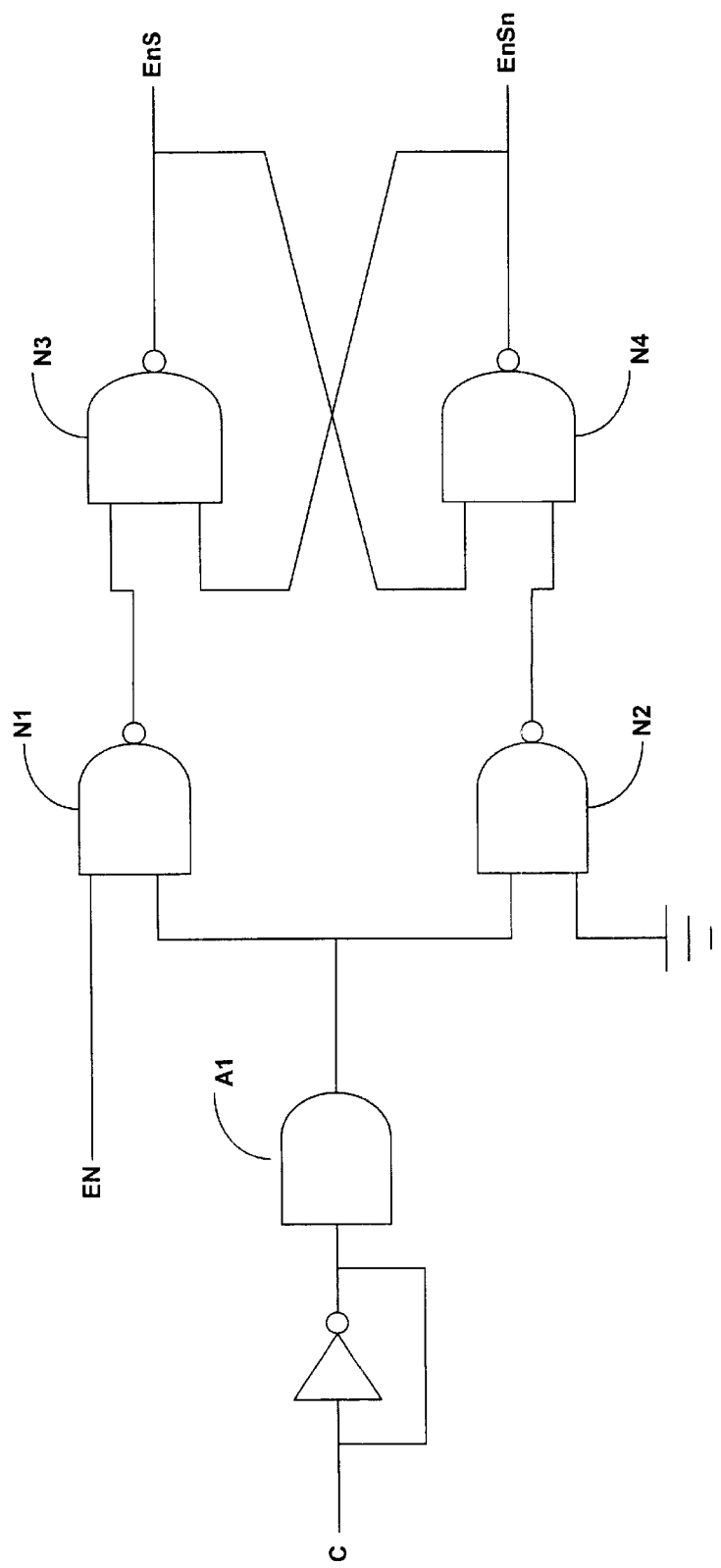
FIG. 8 is a circuit scheme of the device for eliminating the turning on and turning off transients of FIG. 6.

The device 6 can be constituted for example by a set-reset edge-triggered flip-flop of the type shown in FIG. 8. The input signal C and the inverted signal C are in input to a AND gate A1 the output signal of which is in input to two NAND gates N1 and N2. The enable signal En is sent to the other input of the NAND gate N1 while the other input of the NAND gate N2 is to ground. The output signals of the NAND gates N1 and N2 are sent to two other NAND gates N3 and N4 which have in input respectively the signals Ensn (which is the inverted signal Ens) and Ens. How already mentioned, the time waveform of the signal Ens is shown in FIG. 7.

What is claimed is:

1. Power amplification apparatus receiving in input an enable signal (En) and an input square wave signal (C) and for providing an output square wave signal (Vo), characterized by comprising a device (6) receiving said input square wave signal (C) and said enable signal (En) and which produces a new enable signal (Ens) for said apparatus which is synchronized with a rise or down front of the input square wave signal (C), so that said output square wave signal (Vo) of said apparatus, which is normally shifted of a certain period fraction with respect to the square wave signal (C) in input to the apparatus, has the first (Ti) and the last (Tf) pulses which have a duration equal to a period fraction of said output square wave signal (Vo).

2. Apparatus according to claim 1, characterized in that the duration of said first (Ti) and last (Tf) pulse of said square wave signal (Vo) in output from said amplification apparatus is of ¼ of said period of said square wave output signal (Vo).

3. Apparatus according to claim 1, characterized in that said power amplification apparatus is a power PWM apparatus.

4. Apparatus according to claim 1, characterized in that said device (6) is a flip-flop of the type set-reset edge-triggered.

5. Apparatus according to claim 3, characterized by comprising a first amplification stage and a second amplification stage (20), said first amplification stage comprising an integrator stage having an inverting node for receiving said input square wave signal (C) and a squaring stage for squaring the output signal (tri) of said integrator stage, said first amplification stage being disposed in series to said second amplification stage (20) and the output of said second amplification stage (20) being connected to a terminal of a resistor (Rf) which has the other terminal connected to the inverting node of said integrator stage.

6. Apparatus according to claim 5, characterized by comprising a switch (S) interposed between said squaring stage (INV) and said second amplification stage (20), said switch (S) being controlled by said new enable signal (Ens) produced by said device (6) so that the output of said squaring stage (INV) is connected to said second amplification stage (20) when said new enable signal (Ens) is high or so that the output of said squaring stage (INV) is connected to a terminal of a second resistor (Rf1) which has the other terminal connected to the inverting node of said integrator stage (O1, C1, Ri) in the case where said new enable signal (Ens) is low.

7. Apparatus according to claim 5, characterized in that the output signal of said second amplification stage (20) is the output square wave signal (Vo) of said apparatus.

8. Apparatus according to claim 1, characterized in that said input square wave signal (C) has a duty-cycle of 50%.

* * * * *